(12) United States Patent
Kim et al.

(10) Patent No.: US 10,740,010 B2
(45) Date of Patent: Aug. 11, 2020

(54) MEMORY MODULE AND MEMORY SYSTEM INCLUDING MEMORY MODULE

(71) Applicant: Samsung Electronics Co., Ltd., Suwon-si, Gyeonggi-do (KR)

(72) Inventors: Sung-Joon Kim, Hwaseong-si (KR); Dae-Jeong Kim, Seoul (KR); Wonjae Shin, Seoul (KR); Yongjun Yu, Suwon-si (KR); Insu Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/205,357

(22) Filed: Nov. 30, 2018

(65) Prior Publication Data

US 2019/0310784 A1    Oct. 10, 2019

(30) Foreign Application Priority Data

Apr. 4, 2018    (KR) ................. 10-2018-0039208

(51) Int. Cl.
*G06F 3/06*        (2006.01)

(52) U.S. Cl.
CPC .......... *G06F 3/0632* (2013.01); *G06F 3/0604* (2013.01); *G06F 3/068* (2013.01); *G06F 3/0659* (2013.01)

(58) Field of Classification Search
CPC .... G06F 3/0632; G06F 3/0604; G06F 3/0659; G06F 3/068
See application file for complete search history.

(56) References Cited

U.S. PATENT DOCUMENTS

| | | | |
|---|---|---|---|
| 8,626,997 B2 | 1/2014 | Qawami et al. | |
| 8,856,503 B2 | 10/2014 | Shim | |
| 9,176,808 B2* | 11/2015 | Shim | G06F 11/10 |
| 9,552,175 B2* | 1/2017 | Takefman | H03M 13/05 |
| 9,753,793 B2 | 9/2017 | Kumar et al. | |
| 2014/0337589 A1 | 11/2014 | Carpenter et al. | |
| 2016/0342330 A1 | 11/2016 | Chen et al. | |
| 2016/0357454 A1* | 12/2016 | Lee | G06F 3/0611 |
| 2016/0357665 A1* | 12/2016 | Lee | G06F 12/0246 |
| 2017/0115920 A1 | 4/2017 | Subramanian et al. | |
| 2017/0300419 A1 | 10/2017 | Yang et al. | |

* cited by examiner

*Primary Examiner* — Ramon A. Mercado
(74) *Attorney, Agent, or Firm* — Myers Bigel, P.A.

(57) ABSTRACT

A memory module includes a first type memory, a second type memory, a serial presence detect device and a controller. The serial presence detect device is configured to transfer capacity information of the second type memory to an external host device, during an initialization operation. The controller is configured to transfer a training command for the second type memory received from the external host device to the first type memory, during a training operation, which follows in time the initialization operation.

16 Claims, 8 Drawing Sheets

MEMORY MODULE AND MEMORY SYSTEM INCLUDING MEMORY MODULE

REFERENCE TO PRIORITY APPLICATION

This application claims priority under 35 U.S.C. § 119 to Korean Patent Application No. 10-2018-0039208, filed Apr. 4, 2018, in the Korean Intellectual Property Office, the disclosure of which is hereby incorporated by reference herein in its entirety.

BACKGROUND

Embodiments of the inventive concept relate to semiconductor devices and, more particularly, to memory modules and memory systems including the memory modules.

A semiconductor memory is used to store data using semiconductor elements. The semiconductor memory can include a volatile memory such as a dynamic random access memory or a static random access memory, and/or a nonvolatile memory such as a flash memory, a phase-change memory, a ferroelectric memory, a magnetic memory, a resistive memory, or the like.

In general, volatile memory typically supports high-speed random access and is used as a main memory of a computing system such as a personal computer, a server, or a workstation. The nonvolatile memory typically supports a large storage capacity and is used as auxiliary storage of the computing system.

Nowadays, a storage class memory (SCM) is being researched and developed. The storage class memory that is being developed is targeted for supporting both a large nonvolatile storage capacity and a high-speed random access. The storage class memory may be implemented with a nonvolatile memory.

For compatibility with an existing main memory, the storage class memory is being researched and developed on the basis of a memory module of a main memory. However, a difference between an operating characteristic of the dynamic random access memory (DRAM) being a main memory and an operating characteristic of a nonvolatile memory may make it difficult to implement the storage class memory.

SUMMARY

Embodiments of the inventive concept provide a memory module, which provides a storage capacity of a nonvolatile memory to a host and successfully performs a training operation of a dynamic random access memory with the host, and a memory system including the memory module.

According to an exemplary embodiment, a memory module includes a first type memory, a second type memory, a serial presence detect device, which is configured to transfer capacity information of the second type memory to an external host device during an initialization operation, and a controller. The controller is configured to transfer a training command for the second type memory, which is received from the external host device, to the first type memory during a training operation that occurs after the initialization operation.

According to another exemplary embodiment, a memory module includes a first type memory, a second type memory, and a controller, which controls the first type memory so as to perform a training with an external host device during a training operation and provides a storage space of the second type memory to the external host device after the training operation is completed.

According to a further exemplary embodiment, a memory system includes a first type memory module, a second type memory module, and a processor that respectively accesses the first type memory module and the second type memory module after performing a training operation on each of the first type memory module and the second type memory module. The first type memory module includes a first type memory, a second type memory, a serial presence detect device, which transfers capacity information of the second type memory to the processor, before the training operation, and a controller that transfers a training command for the second type memory received from the processor to the first type memory, during the training operation.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
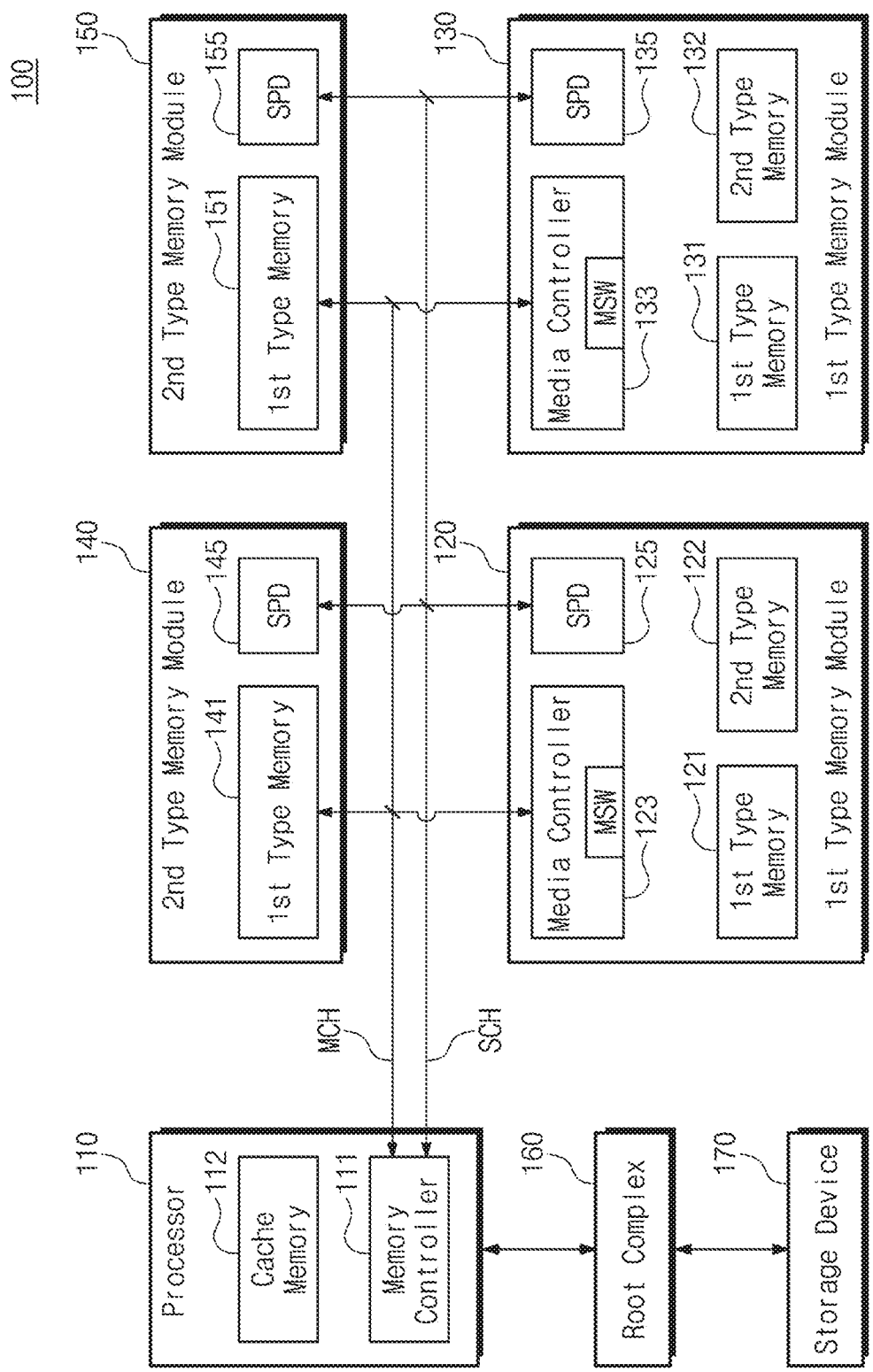
FIG. 1 is a block diagram illustrating a memory system according to an embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 100 according to an embodiment of the inventive concept. This memory system 100 may include a server such as an application server, a client server, or a data server. Or, the memory system 100 may include a personal computer or a workstation.

Referring to FIG. 1, the memory system 100 may include a processor 110, first to fourth memory modules 120 to 150, a root complex 160, and a storage device 170. The processor 110 may control components of the memory system 100 and operations of the components. The processor 110 may execute an operating system and applications and may process data by using the operating system or the applications.

The processor 110 may include a memory controller 111 and a cache memory 112, and the memory controller 111 may access the first to fourth memory modules 120 to 150 through main channels MCH and sub-channels SCH. The cache memory 112 may include a high-speed memory such as a static random access memory (SRAM).

The first to fourth memory modules 120 to 150 may be connected with the memory controller 111 through the main channels MCH and the sub-channels SCH. The main channels MCH may be channels which are used to store (i.e., write) data to the memory modules 120 to 150 (e.g., semiconductor memory modules) or to read data from the memory modules 120 to 150. The main channels MCH may include channels which are respectively provided with regard to the first to fourth memory modules 120 to 150.

The sub-channels SCH may provide additional functions associated with the first to fourth memory modules 120 to 150, except for storing or reading data to or from the first to fourth memory modules 120 to 150. For example, the first to fourth memory modules 120 to 150 may provide the memory controller 111 with their own unique information through the sub-channels SCH. The sub-channels SCH may include channels which are respectively provided with regard to the first to fourth memory modules 120 to 150.

The first to fourth memory modules 120 to 150 may be used as a main memory of the memory system 100. The first to fourth memory modules 120 to 150 may communicate with the memory controller 111 in compliance with one of standards of memory modules such as a dual in-line memory module (DIMM), a registered DIMM (RDIMM), and a load reduced DIMM (LRDIMM).

The root complex 160 may provide channels through which the processor 110 accesses various peripheral devices. For example, the storage device 170 may be connected to the root complex 160. The storage device 170 may include a hard disk drive, an optical disk drive, a solid state drive, etc.

The processor 110 may hierarchically manage the cache memory 112, the first to fourth memory modules 120 to 150 being the main memory, and the storage device 170. For example, the processor 110 may perform operations to transfer data between the storage device 170 and the main memory including the first to fourth memory modules 120 to 150. The processor 110 may also flush data, which need to be backed up, from the data stored in the main memory to the storage device 170.

A portion of a storage region of the main memory including the first to fourth memory modules 120 to 150 may be mapped onto the cache memory 112. And, when there is a need to access a specific storage space of the main memory, the processor 110 may determine whether the specific storage space has been mapped onto the cache memory 112.

For example, in the event the specific storage space has been mapped onto the cache memory 112, the processor 110 may access the specific storage space of the cache memory 112. However, in the event the specific storage space is not mapped onto the cache memory 112, the processor 110 may map (or fetch) a specific storage space of the first to fourth memory modules 120 to 150 onto the cache memory.

When a storage space of the cache memory 112 is insufficient, the processor 110 may release a storage space previously mapped onto the cache memory 112. In the case where data of a storage space to be released have been updated, the processor 110 may flush the updated data to the first to fourth memory modules 120 to 150. The first to fourth memory modules 120 to 150 may include heterogeneous memory modules. Thus, the first and second memory modules 120 and 130 may be first type memory modules, and the third and fourth memory modules 140 and 150 may be second type memory modules.

The first memory module 120 may include a first type memory 121, a second type memory 122, a media controller 123, and a serial presence detect (SPD) device 125. The second memory module 130 may include a first type memory 131, a second type memory 132, a media controller 133, and an SPD device 135. Below, the first type memory modules 120 and 130 will be described with reference to the first memory module 120.

The first type memory 121 may include a high-speed volatile memory, such as a dynamic random access memory (DRAM). The second type memory 122 may include a nonvolatile memory which is typically slower in speed than the first type memory 121, but is typically greater in capacity than the first type memory 121. For example, the second type memory 122 may include a nonvolatile memory such as a flash memory, a phase change memory, a ferroelectric memory, a magnetic (or magneto-resistive) memory, a resistive memory, etc.

The media controller 123 may transfer an access command, which is transferred through a corresponding channel of the main channels MCH from an external host device (e.g., the memory controller 111 or the processor 110) to the first type memory 121 or the second type memory 122. Depending on a command, the media controller 123 may exchange data with an external host device, for example, the memory controller 111 or the processor 110 through the corresponding channel of the main channels MCH.

The media controller 123 may provide a storage capacity or a storage space of the second type memory 122 to an external host device, such as the memory controller 111 within the processor 110. The media controller 123 may use the first type memory 121 as a cache memory of the second type memory 122.

In addition, the media controller 123 may map a portion of a storage space of the second type memory 122 onto the first type memory 121. In the case where a storage space of the second type memory 122 associated with an access command from an external host device, for example, the memory controller 111 or the processor 110 has been mapped onto the first type memory 121, the media controller 123 may transfer the access command to the first type memory 121.

In the case where the storage space of the second type memory 122 associated with the access command from the external host device, for example, the memory controller 111 or the processor 110 is not mapped onto the first type memory 121, the media controller 123 may map (or backup) the storage space onto the first type memory 121 from the second type memory 122.

When a storage space of the first type memory 121 is insufficient, the media controller 123 may release a storage space previously mapped onto the first type memory 121. In the case where data of a storage space to be released have been updated, the media controller 123 may flush the updated data to the second type memory 122.

The media controller 123 may include a media switch MSW. The media switch MSW may be implemented in the form of hardware which is included as a part of an integrated circuit in the media controller 123 or may be implemented in the form of firmware which is executed in the media controller 123. The media switch MSW may control communication with the first type memory 121 and the second type memory 122.

For example, during training, the media switch MSW may be configured to transfer a training command from an external host device, for example, the memory controller 111 or the processor 110 only to the first type memory 121. After the training is completed, the media switch MSW may transfer the access command to the first type memory 121 or the second type memory 122, depending on the access command from the external host device.

The SPD device 125 may communicate with an external host device, for example, the memory controller 111 or the processor 110 through a corresponding channel of the sub-channels SCH. For example, when the first memory module 120 is initialized, the SPD device 125 may provide information stored therein to an external host device, for example, the memory controller 111 or the processor 110 through the corresponding channel of the sub-channels SCH.

For example, the SPD device 125 may store information about a storage capacity to be provided to an external host device, for example, the memory controller 111 or the processor 110 as a storage space of the first memory module 120. For example, the SPD device 125 may store information about the storage capacity of the second type memory 122. During initialization, the SPD device 125 may provide information about the storage capacity of the second type memory 122 to an external host device, for example, the memory controller 111 or the processor 110.

For example, the capacity information stored in the SPD device 125 may include information about a user capacity of the second type memory 122. The storage capacity of the second type memory 122 may include a user capacity, a meta capacity, and a reserved capacity. The user capacity may be a storage capacity which the second type memory 122 provides to the external host device, for example, the memory controller 111.

The meta capacity may be a storage capacity which is used to store various meta information for managing the second type memory 122 and which is not disclosed to the external host device, for example, the memory controller 111. The reserved capacity may be a storage capacity which is secured to manage the second type memory 122 and which is not disclosed to the external host device, for example, the memory controller 111.

The capacity information stored in the SPD device 125 may include information about the user capacity of the second type memory 122. Below, the capacity of the second type memory 122 may be understood as indicating the user capacity of the second type memory 122.

The third memory module 140 may include a first type memory 141 and an SPD device 145. The fourth memory module 150 may include a first type memory 151 and an SPD device 155. Below, the second type memory modules 140 and 150 will be described with reference to the third memory module 140.

The first type memory 141 may include a dynamic random access memory like the first type memory 121 of the first memory module 120. The SPD device 145 may communicate with an external host device, for example, the memory controller 111 or the processor 110 through a corresponding channel of the sub-channels SCH. For example, when the third memory module 140 is initialized, the SPD device 145 may provide information stored therein to an external host device, for example, the memory controller 111 or the processor 110 through the corresponding channel of the sub-channels SCH.

For example, the SPD device 145 may store information about a storage capacity provided to an external host device, for example, the memory controller 111 or the processor 110 as a storage space of the third memory module 140. For example, the SPD device 145 may store information about the storage capacity of the first type memory 141. During initialization, the SPD device 145 may provide information about the storage capacity of the first type memory 141 to an external host device, for example, the memory controller 111 or the processor 110.

When a power is supplied to the memory system 100, the memory controller 111 may perform initialization on the first to fourth memory modules 120 to 150. For example, the SPD devices 125 to 155 of the first to fourth memory modules 120 to 150 may provide the capacity information to the memory controller 111 through the sub-channels SCH, respectively.

The SPD devices 125 and 135 of the first type memory modules 120 and 130 may provide the pieces of capacity information of the second type memories 122 and 132 to the memory controller 111, respectively. The SPD devices 145 and 155 of the second type memory modules 140 and 150 may provide the pieces of capacity information of the first type memories 141 and 151 to the memory controller 111, respectively. For example, the memory controller 111 may read the storage capacities from the SPD devices 125 to 155, respectively.

After initialization is performed, the memory controller 111 may perform training on the first to fourth memory modules 120 to 150. For example, the memory controller 111 may perform training by transferring a training command to the first to fourth memory modules 120 to 150.

The training command may include two or more read commands or two or more write commands. During the training operation, by iteratively transferring commands to the first to fourth memory modules 120 to 150, the memory controller 111 may align timings to transfer commands in synchronization with a clock signal and may check the integrity of storage capacities of the first to fourth memory modules 120 to 150.

The storage spaces of the second type memory modules 140 and 150, which the memory controller 111 identifies, are storage spaces of the first type memories 141 and 151. Accordingly, the training command of the memory controller 111 is transferred to the first type memories 141 and 151.

The storage spaces of the first type memory modules 120 and 130, which the memory controller 111 identifies, are storage spaces of the second type memories 122 and 132. Accordingly, the memory controller 111 may transfer the training command to the storage spaces of the second type memories 122 and 132.

However, the training command of the memory controller 111, which controls main memories, may be determined to coincide with a first type memory, that is, a dynamic random access. A structure or a function of the memory controller 111 should be changed to allow the memory controller 111 to perform training on the storage spaces of the second type memories 122 and 132. However, the change of the existing memory controller 111 causes a significant increase in costs.

To solve the above issue, the first type memory modules 120 and 130 according to an embodiment of the inventive concept may provide the storage spaces of the second type memories 122 and 132 to the memory controller 111 while performing the training operation only on the first type memory 121. Accordingly, it may be possible to provide the storage spaces of the second type memories 122 and 132 to the memory controller 111 without having any influence on the training operation of the memory controller 111 or without causing an abnormal operation.

In the above embodiment, the storage device 170 is illustrated as being connected to the root complex 160. However, a device connected to the root complex 160 is not limited to the storage device 170.

Figure 2:
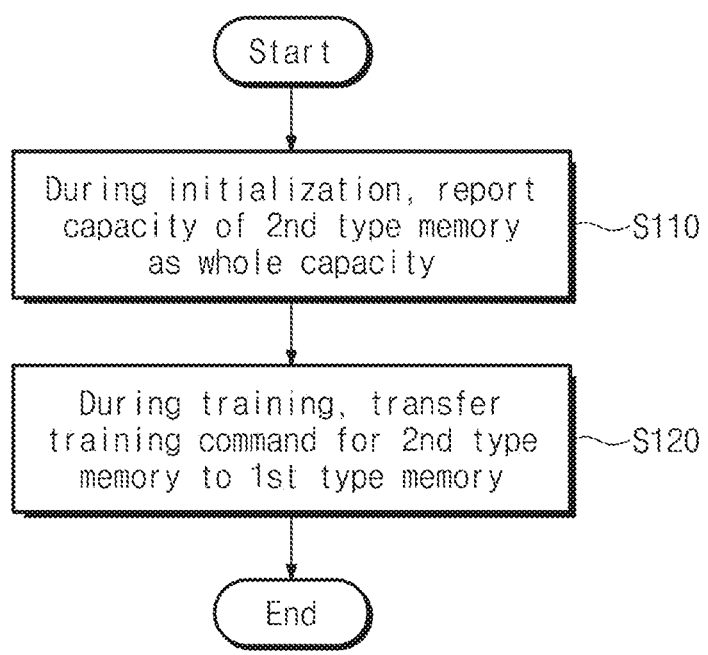
FIG. 2 is a flowchart illustrating an operating method of a first type memory module according to an embodiment of the inventive concept.

FIG. 2 is a flowchart illustrating an operating method of the first type memory module 120 or 130 according to an embodiment of the inventive concept. In an embodiment, an operating method of the first memory module 120 will be described. However, the second memory module 130 may also perform the operating method described with reference to FIG. 2.

Referring to FIGS. 1 and 2, in operation S110, during initialization, the first memory module 120 reports a capacity of the second type memory 122 as the whole capacity of the first memory module 120. For example, the first memory module 120 may transfer capacity information stored in the SPD device 125 to the memory controller 111. The capacity information may include capacity information of the second type memory 122.

In operation S120, during training, the first memory module 120 may transfer the training command for the second type memory 122 received from the memory controller 111 to the first type memory 121. The first type memory 121 may perform the training operation with the memory controller 111 in response to the training command.

By transferring the training command for the second type memory 122 to the first type memory 121 instead of the second type memory 122, the first memory module 120 may have no influence on the training operation and it may therefore prevent the occurrence of an abnormal operation during the training operation.

Figure 3:
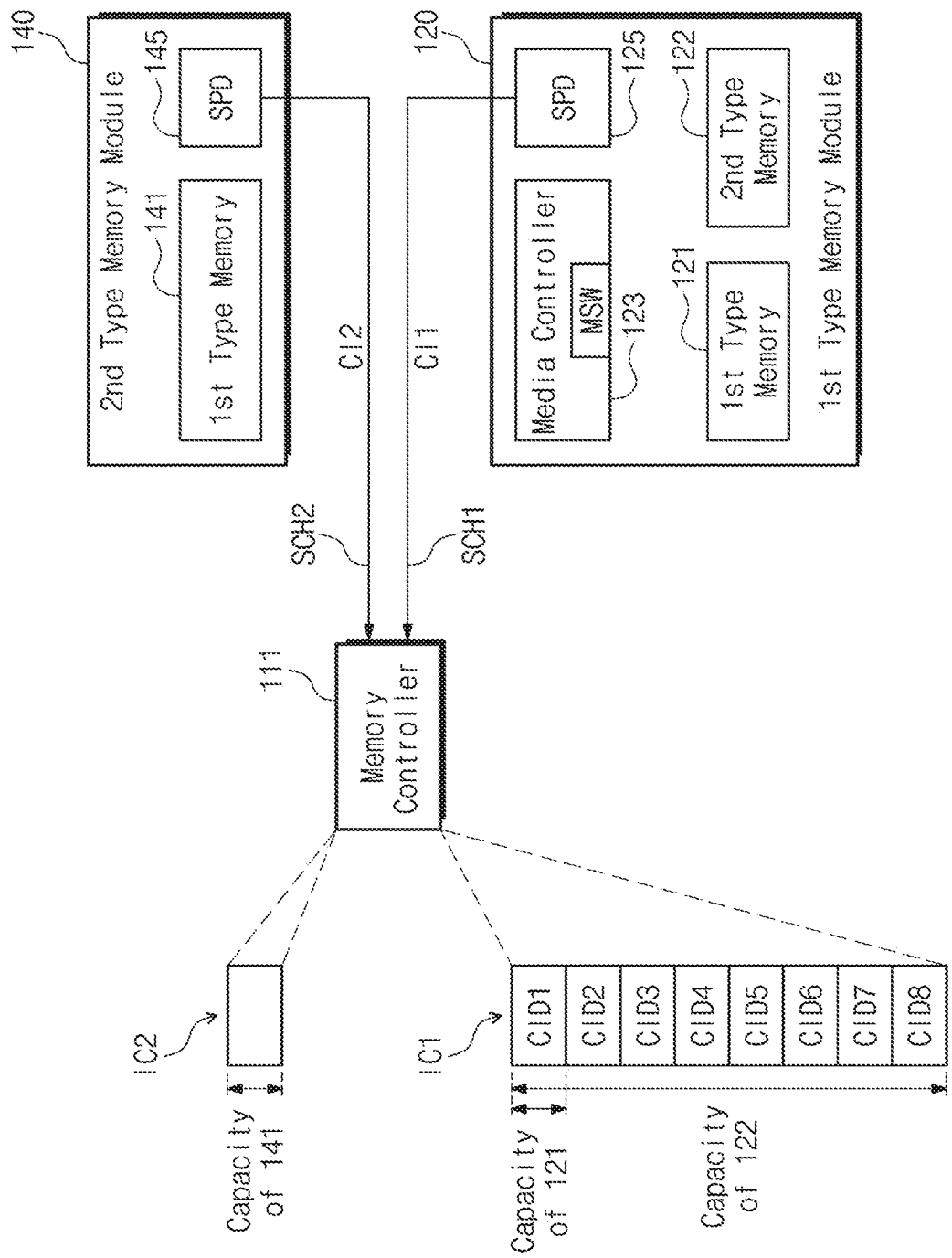
FIG. 3 is a diagram illustrating an example in which a memory controller performs initialization with first and third memory modules.

FIG. 3 is a diagram illustrating an example in which the memory controller 111 performs initialization with the first and third memory modules 120 and 140. Referring to FIG. 3, the first and third memory modules 120 and 140 may transfer first and second capacity information CI1 and CI2 to the memory controller 111 through first and second sub-channels SCH1 and SCH2, respectively. For example, the memory controller 111 may read the first and second capacity information CI1 and CI2 from the SPD devices 125 and 145, respectively.

The first capacity information CI1 may indicate the capacity of the second type memory 122 as a capacity of the first memory module 120. The capacity of the second type memory 122, which the first capacity information CI1 indicates, may be associated with a capacity (hereinafter referred to as a "unit capacity") of the first type memory 121. For example, the capacity of the second type memory 122 included in the first capacity information CI1 may be N times the unit capacity (N being a positive integer).

The first capacity information CI1 may indicate that "N" memories each having the unit capacity exist. For example, the first capacity information CI1 may indicate that "N" ranks each having the unit capacity exist. For example, the first capacity information CI1 may represents the storage space of the second type memory 122 as "N" storage spaces (e.g., virtually distinguished memories) which are distinguished physically or logically.

The memory controller 111 may identify the capacity of the first memory module 120 as a first identified capacity IC1 depending on the first capacity information CI1. The memory controller 111 may assign identifiers to the "N" virtually distinguished memories each having the unit capacity. For example, in the case where "N" is 8, the memory controller 111 may assign first to eighth identifiers CID1 to CID8 to "8" virtual memories having the unit capacity.

Depending on the first capacity information CI1, the memory controller 111 may identify that the "N" memories (e.g., the virtually distinguished memories) are present in the first memory module 120. After the initialization and the training are completed, the memory controller 111 may individually access the "N" memories. After the initialization and the training are completed, the media controller 123 of the first memory module 120 may identify accesses to the "N" memories as accesses to the physically or logically distinguished storage spaces of the second type memory 122.

The second capacity information CI2 may indicate the capacity of the first type memory 141 as the capacity of the third memory module 140. Depending on the second capacity information CI2, the memory controller 111 may identify the capacity of the third memory module 140 as a second identified capacity IC2. For example, depending on the second capacity information CI2, one or more identifiers may be assigned to the second identified capacity IC2.

Figure 4:
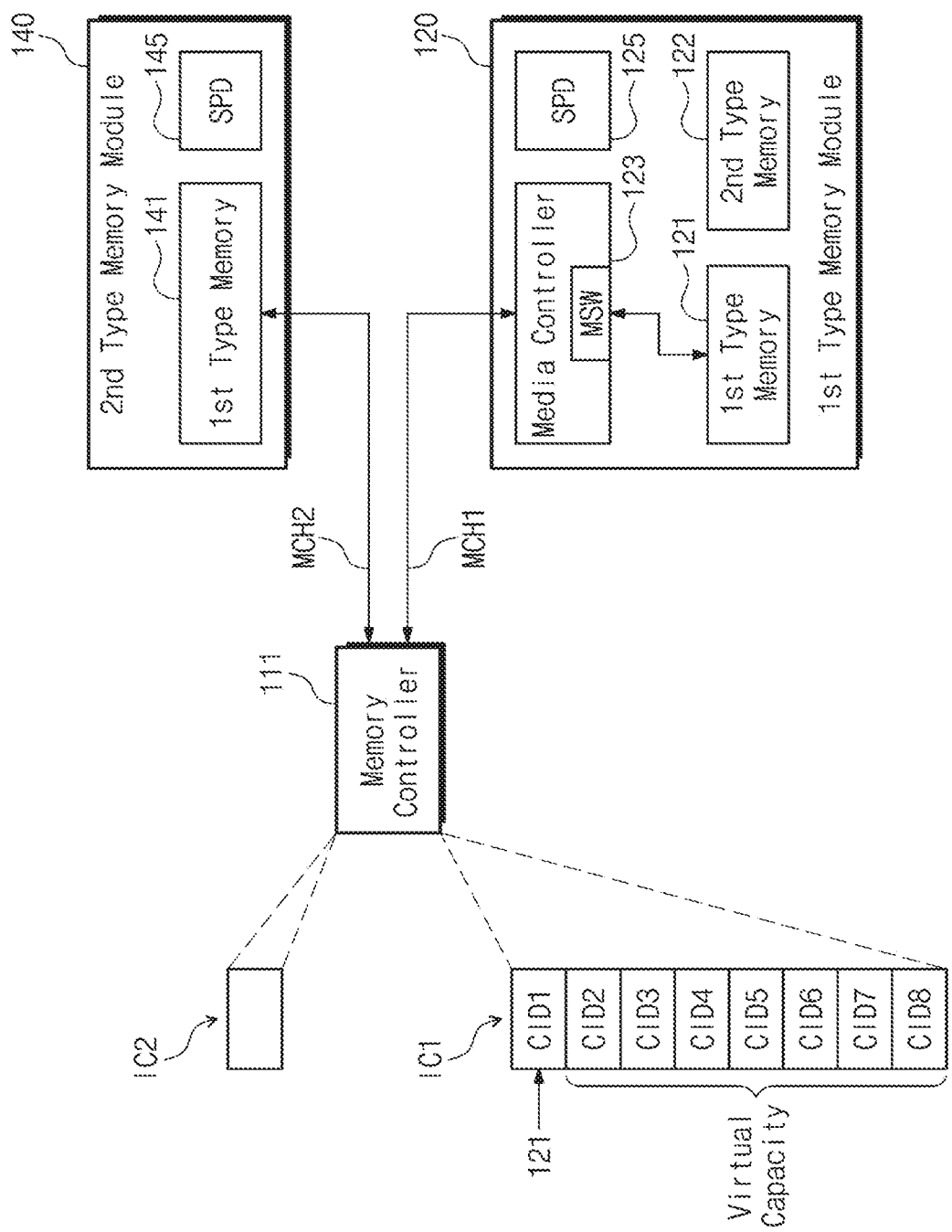
FIG. 4 is a diagram illustrating an example in which a media controller establishes a channel with a memory controller during training after initialization is performed.

FIG. 4 is a diagram illustrating an example in which the media controller 123 establishes a channel with the memory controller 111 during training after initialization is performed. Referring to FIG. 4, a media may communicate with the memory controller 111 through a first main channel MCH1, as shown. The media switch MSW of the media controller 123 may establish a channel only with the first type memory 121 without establishing a channel with the second type memory 122.

A capacity, which corresponds to the first type memory 121, of the first identified capacity IC1 identified by the memory controller 111, for example, includes a capacity to which the first identifier CID1 is assigned and may have an actual storage space. A capacity, which does not correspond to the first type memory 121, of the first identified capacity IC1, for example, includes capacities which the second to eighth identifiers CID2 to CID8 are assigned and may be a virtual capacity which does not have an actual storage space.

Unlike the first memory module 120, the first type memory 141 of the third memory module 140 may establish a direct channel with the memory controller 111 through a second main channel MCH2, as shown. The second identified capacity IC2 may have the storage space of the first type memory 141 in the third memory module 140.

Figure 5:
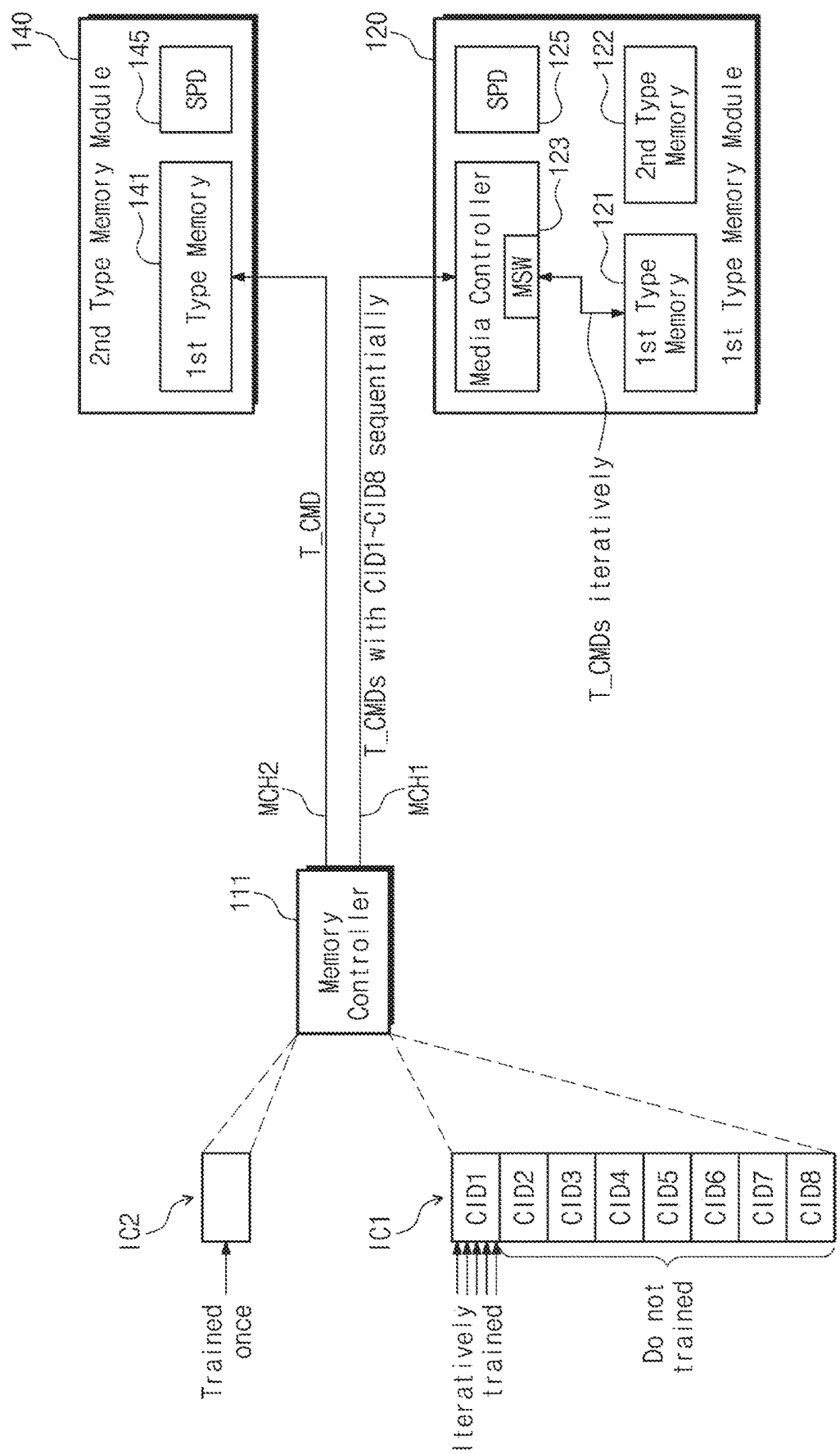
FIG. 5 is a diagram illustrating an example in which a media controller controls training commands during training.

FIG. 5 is a diagram illustrating an example in which the media controller 123 controls training commands during training. Referring to FIG. 5, depending on the first identified capacity IC1, the memory controller 111 recognizes memories having the first to eighth identifiers CID1 to CID8 to be present in the first memory module 120.

Accordingly, the memory controller 111 may sequentially transfer training commands T_CMD having the first to eighth identifiers CID1 to CID8 to the first memory module 120. For example, the memory controller 111 may transfer the training command T_CMD having the first identifier CID1 to the first memory module 120 and may attempt a training operation on a memory having the first identifier CID1.

After the training operation associated with the memory having the first identifier CID1 is completed, the memory controller 111 may transfer the training command T_CMD having the second identifier CID2 to the first memory module 120 and may attempt a training operation on a memory having the second identifier CID2. For example, the training command T_CMD may include various commands such as at least one write command, at least one read command, or at least one refresh command.

The media switch MSW may transfer all the training commands T_CMD to the first type memory 121. For example, the media switch MSW may iteratively transfer the training commands T_CMD to the first type memory 121, regardless of the identifiers CID1 to CID8 included in the training commands T_CMD. For example, the media switch MSW may recognize all the training commands T_CMD to have the first identifier CID1.

As the memory controller 111 sequentially transfers the training commands T_CMD having the first to eighth identifiers CID1 to CID8, the middle switch MSW may iteratively transfer the training commands T_CMD corresponding to the first to eighth identifiers CID1 to CID8 to the first type memory 121.

That is, in the first identified capacity IC1, virtual capacities having the second to eighth identifiers CID2 to CID8 may not be trained, and the capacity of the first type memory 121 having the first identifier CID1 may be iteratively trained.

The first type memory 121 coincides with a training procedure of the first main channel MCH1. Accordingly, when the training commands T_CMD are transferred from the memory controller 111 to the first type memory 121, the first memory module 120 may be prevented from having an influence on the training operation with the memory controller 111 or from causing an abnormal operation.

The initialization or training for the second type memory 122 may be performed by the media controller 123. Accordingly, the initialization and training of the first type memory 121 and the second type memory 122 may be performed without an abnormal operation.

Unlike the first memory module 120, the training command T_CMD for the third memory module 140 is directly transferred to the first type memory 141. The first type memory 141 coincides with a training procedure of the second main channel MCH2. Accordingly, the training of the third memory module 140 is performed without an abnormal operation.

As described above, during the training, the media switch MSW may prevent the training commands T_CMD from be transferred from the memory controller 111 to the second type memory 122. During the training, the media switch MSW may transfer the training commands T_CMD from the memory controller 111 to the first type memory 121. Accordingly, the training operation may be performed without an abnormal operation in the first memory module 120 which provides the second type memory 122 not coinciding with the training procedure of the first main channel MCH1 as a storage space.

Figure 6:
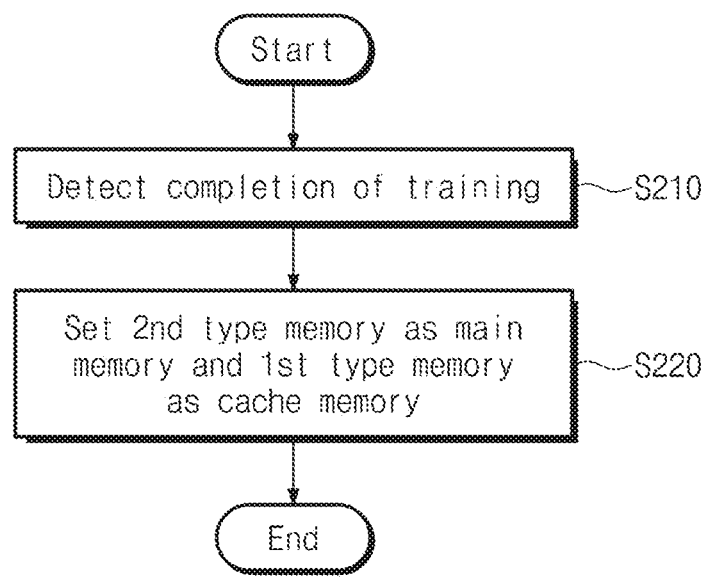
FIG. 6 is a diagram illustrating an example in which a media controller establishes a channel with a second type memory.

FIG. 6 is a diagram illustrating an example in which the media controller 123 establishes a channel with the second type memory 122. Referring to FIGS. 5 and 6, in operation S210, the media controller 123 may detect (or determine) completion of training. When the completion of the training is detected, in operation S220, the media controller 123 may set the second type memory 122 as a main memory and the first type memory 121 as a cache memory.

For example, depending on the first identified capacity IC1, the memory controller 111 may identify the storage capacity of the first memory module 120 as the storage capacity of the second type memory 122. A portion of the storage space of the second type memory 122 may be mapped onto the first type memory 121. In the case where a storage space of the second type memory 122, which the memory controller 111 will access, has been mapped onto the first type memory 121, the media controller 123 may transfer an access command from the memory controller 111 to the first type memory 121.

In the case where the storage space of the second type memory 122, which the memory controller 111 will access, is not mapped onto the first type memory 121, the media controller 123 may map the access-requested storage space onto the first type memory 121 from the second type memory 122. Afterwards, the media controller 123 may transfer the access command from the memory controller 111 to the first type memory 121.

According to an embodiment of the inventive concept, the first memory module 120 may transfer an access request of the memory controller 111 to the first type memory 121, securing an access speed which the memory controller 111 requires. Also, the first memory module 120 may map the storage space of the second type memory 122 onto the first type memory 121 (e.g., backup) or may flush the storage space of the first type memory 121 to the second type memory 122, providing a large storage capacity and a nonvolatile function of the second type memory 122 to the memory controller 111.

Figure 7:
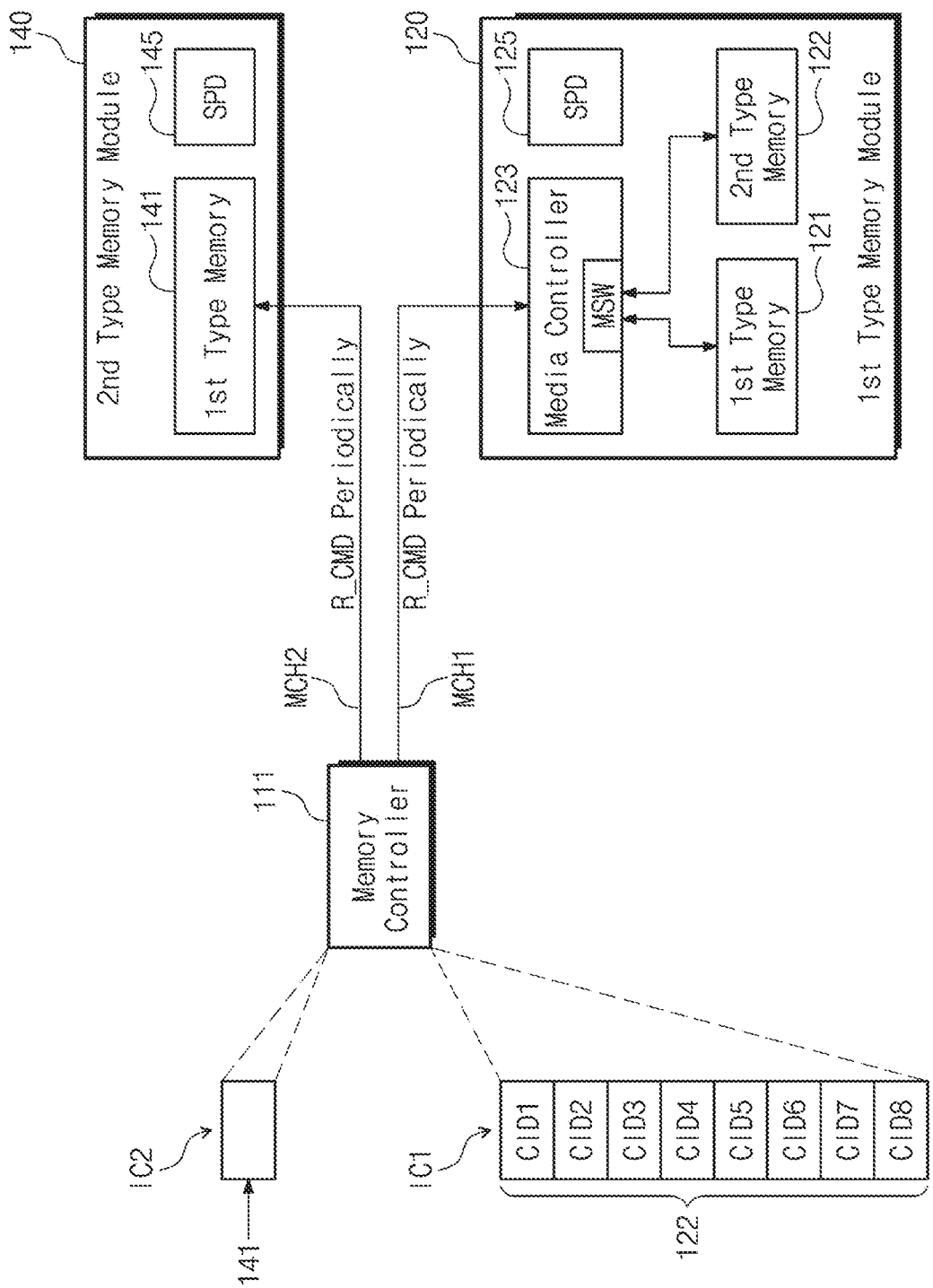
FIG. 7 is a diagram illustrating an example in which a media controller detects completion of training.

FIG. 7 is a diagram illustrating an example in which the media controller 123 detects completion of training. Referring to FIG. 5, initialization and training are performed by a basic input output system (BIOS). When the initialization and the training are completed, the memory controller 111 may periodically transfer a refresh command R_CMD to the first memory module 120 and the third memory module 140.

When the refresh command R_CMD is periodically (or continuously) received, the media controller 123 may detect that the training is completed. For example, when only the refresh command R_CMD is periodically (or continuously) received by the specific number of times or more while any other command is not inserted between the refresh commands R_CMD, the media controller 123 may detect that the training is completed.

When the completion of the training is detected, the media switch MSW may establish a channel with both the first type memory 121 and the second type memory 122. In an embodiment, the refresh command R_CMD may be received in the form of a noise while the training is performed. The media controller 123 may determine whether only the refresh command R_CMD is periodically or continuously received, distinguishing the refresh command R_CMD received in the form of a noise during the training and the refresh command R_CMD received after the training is completed.

Figure 8:
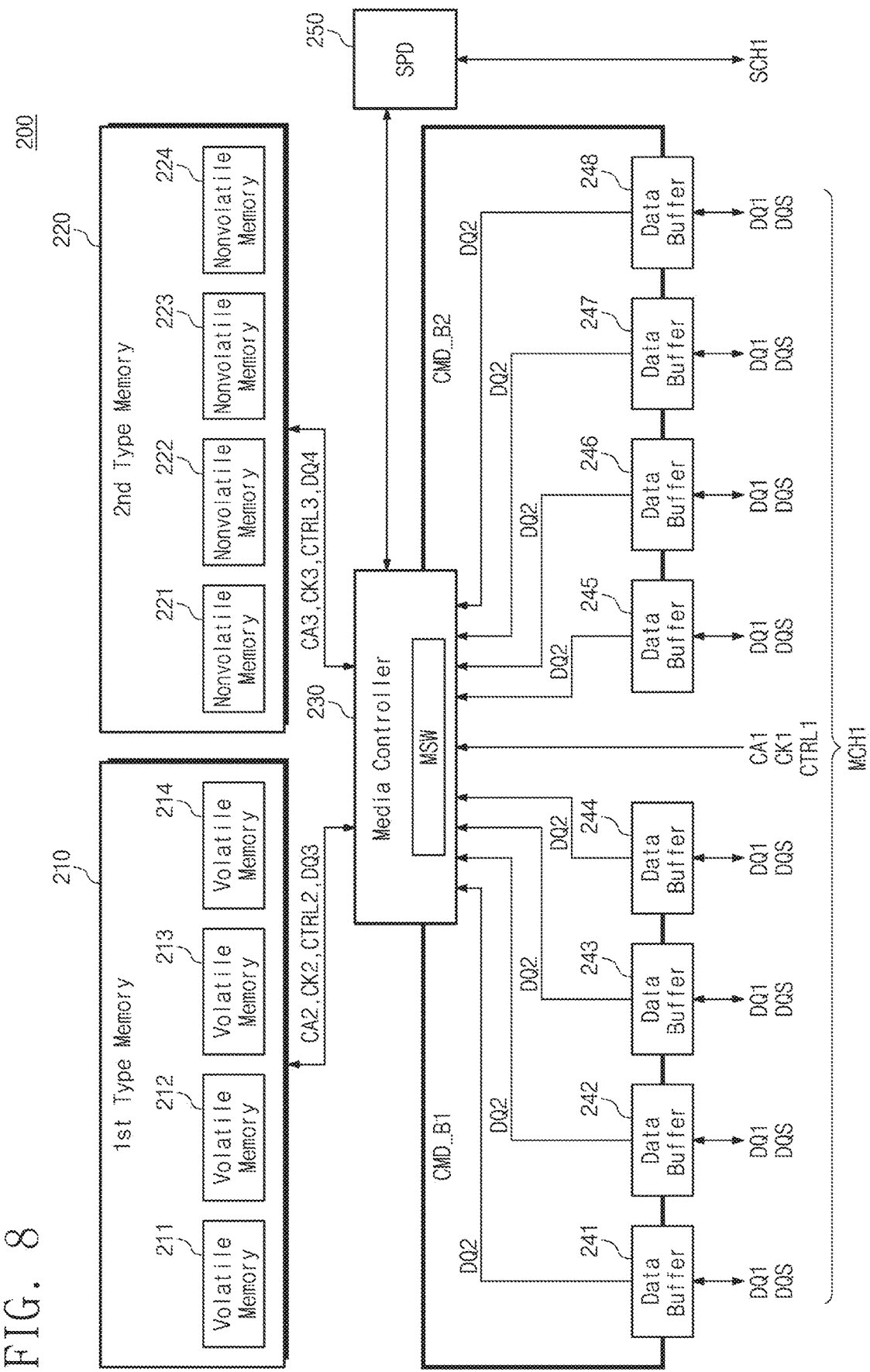
FIG. 8 is a block diagram illustrating a first type memory module according to an embodiment of the inventive concept.

FIG. 8 is a block diagram illustrating a first type memory module 200 according to an embodiment of the inventive concept. In this embodiment, the first type memory module 200 may be a memory module based on the LRDIMM standard. In an embodiment, the first type memory module 200 will be described with reference to the first memory module 120.

Referring to FIGS. 1 and 8, the first type memory module 200 includes a first type memory 210, a second type memory 220, a media controller 230, first to eighth data buffers 241 to 248, and an SPD device 250.

The first type memory 210 may be a volatile memory. For example, the first type memory 210 includes first to fourth volatile memories 211 to 214. The first to fourth volatile memories 211 to 214 may be implemented with packages separated from each other. The first to fourth volatile memories 211 to 214 may include dynamic random access memories.

The second type memory 220 may be a nonvolatile memory. For example, the second type memory 220 may include first to fourth nonvolatile memories 221 to 224. The first to fourth nonvolatile memories 221 to 224 may be implemented with packages separated from each other. The first to fourth nonvolatile memories 221 to 224 may be storage regions of the second type memory 220, which are identified by different addresses.

The second type memory 220 may include at least one of various nonvolatile memory devices such as a flash memory device, a phase change memory device, a ferroelectric memory device, a resistive memory device, and a magneto-resistive memory device.

The media controller 230 may receive a first command and address CA1, a first clock signal CK1, and a first control signal CTRL1 from the memory controller 111. The media controller 230 may exchange second data signals DQ2 with the first to eighth data buffers 241 to 248. The media controller 230 may access the first type memory 210 or the second type memory 220 depending on the first command and address CA1, the first clock signal CK1, and the first control signal CTRL1.

The media controller 230 may transfer a second command and address CA2, a second clock signal CK2, and a second control signal CTRL2 to the first type memory 210 and may exchange third data signals DQ3 with the first type memory 210. The media controller 230 may transfer a third command and address CA3, a third clock signal CK3, and a third control signal CTRL3 to the second type memory 220 and may exchange fourth data signals DQ4 with the second type memory 220.

In an embodiment, the first command and address CA1, the second command and address CA2, and the third command and address CA3 may have different formats. For another example, at least two of the first command and address CA1, the second command and address CA2, and the third command and address CA3 may have the same format. For example, a format which the media controller 230 uses to communicate with the first type memory 210 may be different from a format which the media controller 230 uses to communicate with the second type memory 220.

The media controller 230 may transfer a first buffer command CMD_B1 to control the first to fourth data buffers 241 to 244. The media controller 230 may transfer a second buffer command CMD_B2 to control the fifth to eighth data buffers 245 to 248.

The media controller 230 may include the media switch MSW. As described above, when the first type memory module 200 is initialized, the media switch MSW may transfer a training command for the second type memory 220, which is transferred from the memory controller 111, to the first type memory 210. When training is completed, the media switch MSW may provide a storage capacity of the second type memory 220 to the memory controller 111 as a storage space of the first type memory module 200.

The first to eighth data buffers 241 to 248 may exchange the first data signals DQ1 with the memory controller 111 through the first main channel MCH1 in synchronization with data strobe signals DQS. The first to eighth data buffers 241 to 248 may transfer the first data signals DQ1 received from the memory controller 111 through the first main channel MCH1 to the media controller 230 as the second data signals DQ2.

The first to eighth data buffers 241 to 248 may transfer the second data signals DQ2 received from the media controller 230 to the memory controller 111 through the first main channel MCH1 as the first data signals DQ1. The first to eighth data buffers 241 to 248 may be implemented with packages separated from each other.

The SPD device 250 may communicate with the media controller 230 and may communicate with the memory controller 111 through a first sub-channel SCH1. The SPD device 250 may be based on at least one of various communication manners such as a system management bus (SMBus) and an inter-integrated circuit (I2C).

In an embodiment, the first type memory 210 may be used as a cache memory of the second type memory 220. A portion of the storage space of the second type memory 220 may be mapped onto the first type memory 210.

When a first storage space indicated by the first command and address CA1 received from the memory controller 111 has been mapped onto the first type memory 210, that is, when a cache hit occurs, the memory controller 111 may transfer the second command and address CA2 to the first type memory 210. The first type memory 210 may perform a read or write operation depending on the second command and address CA2.

When the first storage space indicated by the first command and address CA1 received from the memory controller 111 is not mapped onto the first type memory 210, that is, when a cache miss occurs, the memory controller 111 may map the first storage space indicated by the first command and address CA1 onto the first type memory 210.

For example, a second storage space associated with the first storage space of the second type memory 220 may be secured for the first type memory 210. When a storage space of the first type memory 210 is insufficient, the media controller 230 may secure a storage space at the first type memory 210 by discarding any other storage space mapped onto the first type memory 210 or returning any other storage space to the second type memory 220.

In the case where data have been stored in the first storage space of the second type memory 220, the media controller 230 may copy data of the first storage space to the second storage space of the first type memory 210. Afterwards, the media controller 230 may transfer the second command and address CA2 to the first type memory 210. The first type memory 210 may perform a read or write operation on the second storage space in response to the second command and address CA2.

When intending to release the second storage space from the first type memory 210, the media controller 230 may check whether the second storage space is "dirty." For example, when a write operation is performed on the second storage space, the second storage space may be determined as being "dirty."

In the case where the second storage space is not "dirty," the media controller 230 may release the second storage space by discarding data of the second storage space. In the case where the second storage space is "dirty," the media controller 230 may return the second storage space by writing data of the second storage space to the second type memory 220. After the second storage space is returned, the media controller 230 may release the second storage space by discarding the second storage space.

For another example, the first type memory 210 and the second type memory 220 may be directly accessed by the memory controller 111. For example, when the first command and address CA1 or the first control signal CTRL1 indicates the first type memory 210, the media controller 230 may convey the second command and address CA2, the second clock signal CK2, or the second control signals CTRL2 to the first type memory 210.

When the first command and address CA1 or the first control signal CTRL1 indicates the second type memory 220, the media controller 230 may convey the third command and address CA3, the third clock signal CK3, or the third control signal CTRL3 to the second type memory 220.

In an embodiment, the number of volatile memories, the number of nonvolatile memories, and the number of data buffers are not limited. The number of volatile memories or nonvolatile memories may be the same as the number of data buffers. The number of data buffers may be changed to "9".

According to the inventive concept, a semiconductor memory module provides a storage capacity of a nonvolatile memory to a host, and training with the host is performed only on a dynamic random access memory. Accordingly, a memory module, which provides a storage capacity of the nonvolatile memory to the host while performing training with the host without an error, and a memory system including the memory module are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory module comprising:
a first type memory;
a second type memory;
a serial presence detect device configured to transfer capacity information of the second type memory to an external host device, during an initialization operation; and
a controller configured to transfer a training command for the second type memory to the first type memory, during a training operation that follows, in time, the initialization operation;
wherein the training command is received from the external host device; and wherein a second capacity of the second type memory is N times a first capacity of the first type memory, where N is a positive integer greater than one;
wherein the capacity information indicates that N memories exist, which each have the first capacity; and
wherein, during the training operation, the controller sequentially transfers N training commands, which are respectively received from the external host device with regard to the N memories, to the first type memory.

2. The memory module of claim 1, wherein during the training operation the controller recognizes an address of each of the N training commands as the same address indicating the first type memory.

3. The memory module of claim 1, wherein, when the capacity information is read, the controller prevents the training command from the external host device from being transferred to the second type memory.

4. The memory module of claim 1, wherein, when the training operation is completed, the controller uses the second type memory as a main memory and the first type memory as a cache memory for the second type memory.

5. The memory module of claim 4, wherein, when a refresh command is received from the external host device, the controller determined that the training operation is completed.

6. The memory module of claim 1, wherein the first type memory includes one or more dynamic random access memories.

7. The memory module of claim 1, wherein the second type memory includes one or more nonvolatile memories; and wherein the first type memory is a different type memory relative to the second type memory.

8. The memory module of claim 1, wherein, when data to be accessed by the external host device have been stored in the second type memory, the controller copies the data from the second type memory to the first type memory.

9. The memory module of claim 1, wherein, when data to be accessed by the external host device have been stored in the first type memory, the controller transfers an access command received from the external host device to the first type memory.

10. The memory module of claim 1, further comprising:
data buffers connected with the controller and configured to buffer data exchanged with the external host device.

11. A memory module comprising:
a first type memory;
a second type memory;
a serial presence detect device configured to transfer capacity information of the second type memory to an external host device, during an initialization operation; and
a controller configured to control the first type memory so as to perform a training with an external host device during a training operation and configured to provide a storage space of the second type memory to the external host device after the training operation is completed;

wherein the capacity information indicates that N memories exist; and wherein, during the training operation, the controller sequentially transfers N training commands, which are respectively received from the external host device with regard to the N memories, to the first type memory.

12. The memory module of claim 11, wherein the controller provides only the storage space of the second type memory except for a storage space of the first type memory to the external host device.

13. The memory module of claim 11, wherein the controller communicates with the external host device in compliance with a standard of a memory module including a dual in-line memory module (DIMM), a registered DIMM (RDIMM), a load reduced DIMM (LRDIMM).

14. A memory system comprising:
a first type memory module;
a second type memory module; and
a processor configured to respectively access the first type memory module and the second type memory module after performing a training operation on each of the first type memory module and the second type memory module;
wherein the first type memory module comprises:
a first type memory;
a second type memory;
a serial presence detect device configured to transfer capacity information of the second type memory to the processor, during an initialization operation; and
a controller configured to transfer a training command for the second type memory to the first type memory, during a training operation that follows, in time, the initialization operation;
wherein the capacity information indicates that N memories exist; and
wherein the processor transfers training commands to the N memories by using identifiers of the N memories, respectively; and wherein the controller recognizes the identifiers of the training commands as the same identifier indicating the first type memory.

15. The memory system of claim 14, wherein each of the N memories has a first capacity; and wherein depending on the capacity information the processor identifies that the N memories exist in the first type memory module.

16. The memory system of claim 14, wherein the second type memory module includes:
a dynamic random access memory; and
a serial presence detect device configured to transfer capacity information of the dynamic random access memory to the processor.

* * * * *